United States Patent
Hwang et al.

(10) Patent No.: US 10,627,206 B2
(45) Date of Patent: Apr. 21, 2020

(54) SENSOR MODULE FOR DETECTING A PROCESS ENVIRONMENT IN SEMICONDUCTOR EQUIPMENT, A SEMICONDUCTOR MANUFACTURING APPARATUS, AND A METHOD OF MANUFACTURING A SEMICONDUCTOR DEVICE

(71) Applicant: SAMSUNG ELECTRONICS CO., LTD., Suwon-si, Gyeonggi-Do (KR)

(72) Inventors: Young-ho Hwang, Hwaseong-si (KR); Sang-yoon Soh, Yongin-si (KR); Dae-hee Lee, Seoul (KR); Dae-sung Jung, Pohang-si (KR); Dong-ouk Kim, Chuncheon-si (KR); Jong-min Song, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 67 days.

(21) Appl. No.: 15/942,876

(22) Filed: Apr. 2, 2018

(65) Prior Publication Data

US 2019/0113324 A1  Apr. 18, 2019

(30) Foreign Application Priority Data

Oct. 12, 2017 (KR) .................. 10-2017-0132755

(51) Int. Cl.
*G01R 29/12* (2006.01)
*G01B 7/00* (2006.01)
*G01P 15/08* (2006.01)
*H01L 21/67* (2006.01)

(52) U.S. Cl.
CPC .......... *G01B 7/003* (2013.01); *G01P 15/0802* (2013.01); *G01R 29/12* (2013.01); *H01L 21/67259* (2013.01); *H01L 21/67173* (2013.01); *H01L 21/67253* (2013.01); *H01L 2224/16225* (2013.01); *H01L 2924/15192* (2013.01)

(58) Field of Classification Search
CPC ..... G01B 7/003; G01P 15/0802; G01R 29/12; H01L 21/67173; H01L 21/67253; H01L 21/67259; H01L 2224/16225; H01L 2924/15192; H01L 21/67288; G01D 21/02
See application file for complete search history.

(56) References Cited

U.S. PATENT DOCUMENTS

| | | | |
|---|---|---|---|
| 5,367,429 A * | 11/1994 | Tsuchitani | B81B 3/0008 361/280 |
| 6,660,540 B2 | 12/2003 | Englisch | |
| 6,781,205 B1 | 8/2004 | Levit et al. | |
| 7,994,793 B2 | 8/2011 | Matsumoto et al. | |
| 8,055,376 B2 | 11/2011 | Doki et al. | |
| 9,268,739 B2 | 2/2016 | Akada | |

(Continued)

FOREIGN PATENT DOCUMENTS

KR    10-2007-0045524    5/2007

*Primary Examiner* — Vinh P Nguyen
(74) *Attorney, Agent, or Firm* — F. Chau & Associates, LLC

(57) ABSTRACT

A sensor module for detecting a process environment in semiconductor equipment includes: a sensor body including a first plate and a second plate; and a sensor circuit unit in the sensor body, wherein the sensor circuit unit includes a static electricity sensor between the first plate and the second plate.

19 Claims, 10 Drawing Sheets

(56) References Cited

U.S. PATENT DOCUMENTS

| | | | |
|---|---|---|---|
| 9,274,153 B2* | 3/2016 | Kakimoto | G01R 27/2605 |
| 9,476,900 B2 | 10/2016 | Akada | |
| 2001/0040262 A1* | 11/2001 | Uchida | B81C 1/00269 |
| | | | 257/415 |
| 2010/0117224 A1* | 5/2010 | McElrea | H01L 24/24 |
| | | | 257/723 |
| 2012/0127094 A1* | 5/2012 | Jeong | G06F 3/044 |
| | | | 345/173 |

* cited by examiner

SENSOR MODULE FOR DETECTING A PROCESS ENVIRONMENT IN SEMICONDUCTOR EQUIPMENT, A SEMICONDUCTOR MANUFACTURING APPARATUS, AND A METHOD OF MANUFACTURING A SEMICONDUCTOR DEVICE

CROSS-REFERENCE TO RELATED APPLICATION

This application claims priority under 35 U.S.C. § 119 to Korean Patent Application No. 10-2017-0132755, filed on Oct. 12, 2017, in the Korean Intellectual Property Office, the disclosure of which is incorporated by reference herein in its entirety.

TECHNICAL FIELD

The inventive concept relates to semiconductor equipment, and more particularly, to a sensor module, a semiconductor manufacturing apparatus, and a method of manufacturing a semiconductor device.

DISCUSSION OF RELATED ART

Semiconductor devices are manufactured in semiconductor equipment that perform various processes such as a depositing process, an etching process, and a cleaning process. As semiconductor products become smaller and more highly integrated, a process environment of the semiconductor equipment can greatly influence the semiconductor products. Therefore, techniques are being developed to increase the reliability of the semiconductor products and a yield of a semiconductor manufacturing line.

SUMMARY

According to an exemplary embodiment of the inventive concept, there is provided a sensor module for detecting a process environment in semiconductor equipment, the sensor module including: a sensor body including a first plate and a second plate; and a sensor circuit unit in the sensor body, wherein the sensor circuit unit comprises a static electricity sensor between the first plate and the second plate.

According to an exemplary embodiment of the inventive concept, there is provided a sensor module for detecting a process environment in semiconductor equipment, the sensor module including: a first sensor configured to sense a process environment to which the sensor module is exposed; a second sensor configured to detect a position of the sensor module in the semiconductor equipment; and a signal processing module configured to, generate process environment sensing information about the process environment based on a signal output from the first sensor, and generate position information of the sensor module based on a signal output from the second sensor.

According to an exemplary embodiment of the inventive concept, there is provided a semiconductor manufacturing apparatus including: a chamber; a sensor module configured to move in the chamber, the sensor module comprising a first sensor configured to sense a process environment in the chamber and a second sensor configured to detect a position of the sensor module in the chamber; and an analyzing apparatus configured to detect a defect in the process environment in the chamber based on a first signal output from the first sensor and a second signal output from the second sensor.

According to an exemplary embodiment of the inventive concept, there is provided a method of manufacturing a semiconductor device, including: putting a sensor module in semiconductor equipment and monitoring a process environment in the semiconductor equipment; removing a defect in the process environment of the semiconductor equipment that is detected through the monitoring; and putting a wafer in the semiconductor equipment and performing semiconductor manufacturing processes on the wafer, wherein the monitoring of the process environment in the semiconductor equipment comprises: generating process environment sensing information about the process environment sensed in the semiconductor equipment by using the sensor module and generating position information about a position of the sensor module in the semiconductor equipment; and detecting the defect in the process environment using the process environment sensing information and detecting a position where the defect in the process environment is generated using the position information.

According to an exemplary embodiment of the inventive concept, there is provided a sensor module for detecting a process environment in semiconductor equipment, the sensor module comprising: a sensor circuit unit disposed between a first plate and a second plate, the sensor circuit unit including a static electricity sensor and an acceleration sensor; the sensor circuit unit further including a sensing information generator configured to generate process environment sensing information based on an amount of static electricity detected by the static electricity sensor, and a position information generator configured to generate position information based on acceleration information provided from the acceleration sensor.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
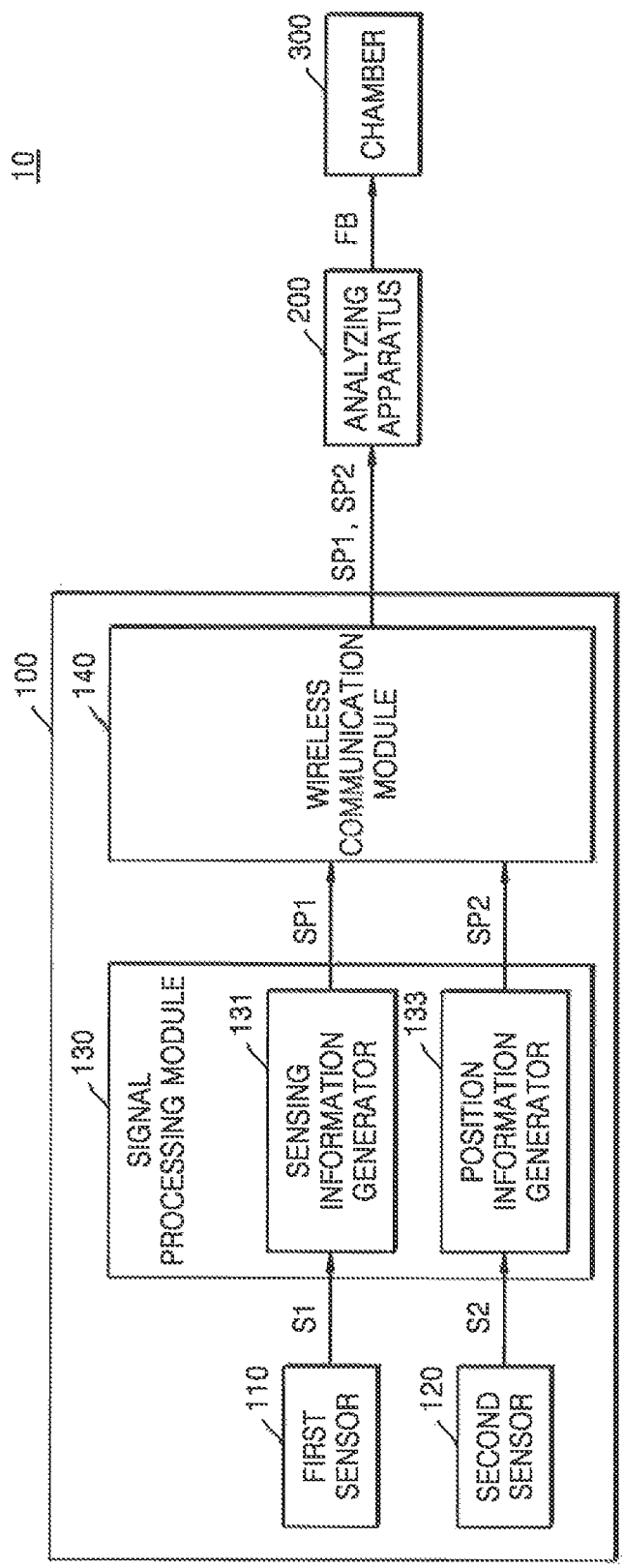
FIG. 1 is a block diagram illustrating a semiconductor manufacturing apparatus according to an exemplary embodiment of the inventive concept.

FIG. 1 is a block diagram illustrating a semiconductor manufacturing apparatus 10 according to an exemplary embodiment of the inventive concept.

Referring to FIG. 1, the semiconductor manufacturing apparatus 10 may include a sensor module 100, an analyzing apparatus 200, and a chamber 300.

The sensor module 100 may be used to monitor a process environment applied to a wafer during semiconductor manufacturing processes. The sensor module 100 may sense a process environment in semiconductor equipment and may provide information on the sensed process environment to the analyzing apparatus 200. The sensor module 100 may sense the process environment while moving along a movement path of the wafer in the semiconductor equipment.

The sensor module 100 may include a first sensor 110, a second sensor 120, a signal processing module 130, and a wireless communication module 140.

The first sensor 110 may sense the process environment applied to the sensor module 100. The first sensor 110 may generate a first output signal S1 related to the process environment and may transmit the first output signal S1 to the signal processing module 130. For example, the first sensor 110 may measure the process environment applied to the sensor module 100. For example, the first sensor 110 may measure static electricity, pressure, vibration, temperature, humidity, and/or shock applied to the sensor module 100. The first output signal S1 output from the first sensor 110 may include values corresponding to characteristics of the process environment applied to the sensor module 100 at specific positions on a movement path of the wafer at specific points in time. For example, the first output signal S1 may include a static electricity value, a pressure value, a vibration value, a temperature value, a humidity value, and/or a shock value for a first position at a first time.

The first sensor 110 may include various sensors for sensing the process environment in the semiconductor equipment. For example, the first sensor 110 may include a static electricity sensor, a potential sensor, a pressure sensor, a vibration sensor, a temperature sensor, and/or a humidity sensor. However, the inventive concept is not limited thereto. For example, the first sensor 110 may include various sensors for sensing the process environment other than those mentioned above.

The second sensor 120 may be used to detect a position of the sensor module 100 as it moves along the movement path of the wafer in the semiconductor equipment. The second sensor 120 may generate a second output signal S2 for identifying the position of the sensor module 100 and may transmit the second output signal S2 to the signal processing module 130.

The second sensor 120 may include various sensors for detecting the position of the sensor module 100 as the sensor module 100 moves in the semiconductor equipment. In addition, the second sensor 120 may include various sensors for correcting the calculated position of the sensor module 100. For example, the second sensor 120 may include an acceleration sensor, a displacement sensor, and/or a gyro sensor. However, the inventive concept is not limited thereto. For example, the second sensor 120 may include various sensors for detecting the position of the sensor module 100 other than those mentioned above.

The signal processing module 130 may generate process environment sensing information SP1 related to the process environment applied to the sensor module 100 based on the first output signal S1 output from the first sensor 110. The signal processing module 130 may also generate position information SP2 for detecting the position of the sensor module 100 in the semiconductor equipment based on the second output signal S2 output from the second sensor 120. The signal processing module 130 may include various algorithms for processing the first output signal S1 and the second output signal S2 and may be implemented by a micro controller unit.

The signal processing module 130 may include a sensing information generator 131 and a position information generator 133.

The sensing information generator 131 may generate the process environment sensing information SP1 by processing the first output signal S1 transmitted from the first sensor 110. A signal processing algorithm for processing the first output signal S1 may be provided in the sensing information generator 131. For example, the process environment sensing information SP1 may include a change in process environment characteristic values over time. The process environment sensing information SP1 generated by the sensing information generator 131 may be transmitted to the wireless communication module 140.

The position information generator 133 may generate the position information SP2 by processing the second output signal S2 transmitted from the second sensor 120. A signal processing algorithm for processing the second output signal S2 may be provided in the position information generator 133. For example, the position information SP2 may include a change in position of the sensor module 100 over time. In other words, the position information SP2 may include displacement of the sensor module 100 in an X axis direction over time, displacement of the sensor module 100 in a Y axis direction over time, and displacement of the sensor module 100 in a Z axis direction over time. Using the position information SP2, the position of the sensor module 100 may be detected at a specific point in time. In particular, although the sensor module 100 may be moved to a section that is not visible from the outside of the semiconductor equipment, the position of the sensor module 100 in that unseen area may nevertheless be known by using the position information SP2. The position information SP2 generated by the position information generator 133 may be transmitted to the wireless communication module 140.

The wireless communication module 140 may communicate with the analyzing apparatus 200 outside the sensor module 100 in real time. The wireless communication module 140 may receive the process environment sensing information SP1 and the position information SP2 that are generated by the signal processing module 130 and may transmit the received process environment sensing information SP1 and position information SP2 to the analyzing apparatus 200. The analyzing apparatus 200 may include a communication module required for communications with the wireless communication module 140. The wireless communication module 140 may communicate with the analyzing apparatus 200 by using a communication method such as Wi-Fi, Bluetooth, or ZigBee.

The analyzing apparatus 200 may include a personal computer (PC), a workstation, or a supercomputer. An analyzing program for analyzing information transmitted from the sensor module 100 may be provided in the analyzing apparatus 200. The analyzing apparatus 200 may detect a defect in a process environment and a location in the process environment where the defect is generated by analyzing the process environment sensing information SP1 and the position information SP2 that are transmitted from the sensor module 100. In other words, when a defect in the process environment is detected using the process environment sensing information SP1, the position where the defect occurs in the process environment may be identified by using the position information SP2. For example, the analyzing apparatus 200 may determine whether the defect in the process environment is generated in a specific section in the semiconductor equipment or in a particular piece of equipment. The analyzing apparatus 200 may also determine whether the defect in the process environment is generated due to a specific semiconductor manufacturing process.

The chamber 300 may provide the same atmosphere as the semiconductor manufacturing processes performed on the wafer to the sensor module 100. For example, the chamber 300 may include a process chamber for performing the semiconductor manufacturing processes on the wafer and a transfer chamber for inserting the wafer into or removing the wafer from the process chamber. The transfer chamber may move the sensor module 100 along the movement path of the wafer. In more detail, for example, the process chamber may provide the same atmosphere used in the semiconductor manufacturing processes performed on the wafer, for example, a drying process, a cleaning process, a depositing process, an etching process, and/or a diffusing process to the sensor module 100.

In an exemplary embodiment of the inventive concept, when a defect in the process environment is detected, the analyzing apparatus 200 generates a feedback signal FB for removing the defect in the process environment and may provide the feedback signal FB to the chamber 300. The chamber 300 may perform maintenance to prevent the defect from occurring in the process environment at the specific section in the semiconductor equipment or in the particular piece of equipment in which the defect was found. The chamber 300 may also be used to determine and/or suggest new process conditions for the semiconductor manufacturing process that causes the defect in the process environment in accordance with the feedback signal FB applied from the analyzing apparatus 200.

Figure 2:
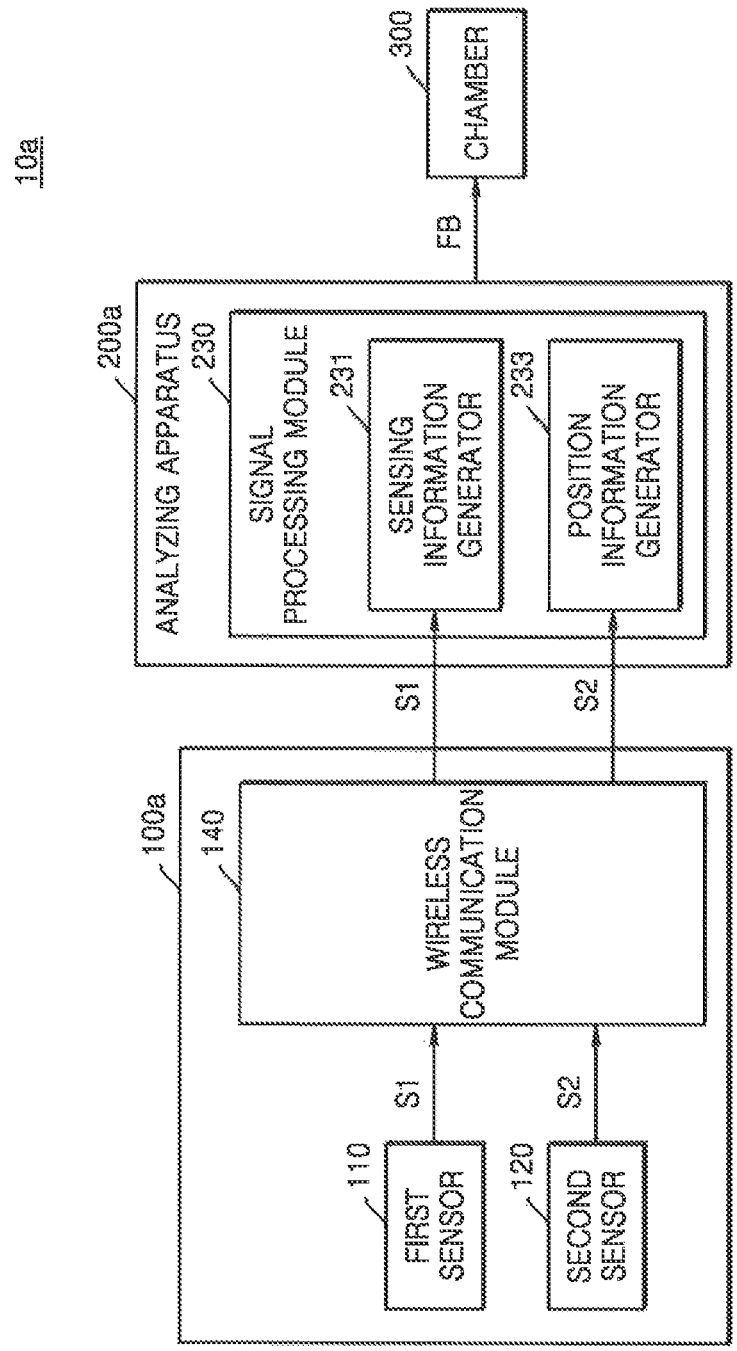
FIG. 2 is a block diagram illustrating a semiconductor manufacturing apparatus according to an exemplary embodiment of the inventive concept.

FIG. 2 is a block diagram illustrating a semiconductor manufacturing apparatus 10a according to an exemplary embodiment of the inventive concept.

The semiconductor manufacturing apparatus 10a illustrated in FIG. 2 may have the same configuration as the semiconductor manufacturing apparatus 10 illustrated in FIG. 1 except that a signal processing module 230 is provided in an analyzing apparatus 200a. In FIGS. 1 and 2, the same reference numerals denote the same elements, and thus, a detailed description of the same elements may not be given when discussing FIG. 2.

Referring to FIG. 2, a sensor module 100a may transmit the first output signal S1 generated by the first sensor 110 and the second output signal S2 generated by the second sensor 120 to the analyzing apparatus 200a. In other words, the first sensor 110 outputs the first output signal S1 related to the process environment applied to the sensor module 100a in the semiconductor equipment to the wireless communication module 140. In addition, the second sensor 120 outputs the second output signal S2 related to a position of the sensor module 100a in the semiconductor equipment to the wireless communication module 140. The wireless communication module 140 may transmit the first output signal S1 and the second output signal S2 to the analyzing apparatus 200a in real time.

The analyzing apparatus 200a may include the signal processing module 230. The signal processing module 230 may include a sensing information generator 231 for generating process environment sensing information by processing the first output signal S1 transmitted from the first sensor 110. The signal processing module 230 may also include a position information generator 233 for generating position information by processing the second output signal S2 transmitted from the second sensor 120. The analyzing apparatus 200a may detect a defect in the process environment and the position in which the defect in the process environment is generated by analyzing the process environment sensing information generated by the sensing information generator 231 and the position information generated by the position information generator 233. The analyzing apparatus 200a may provide the feedback signal FB to the chamber 300

Figure 3:
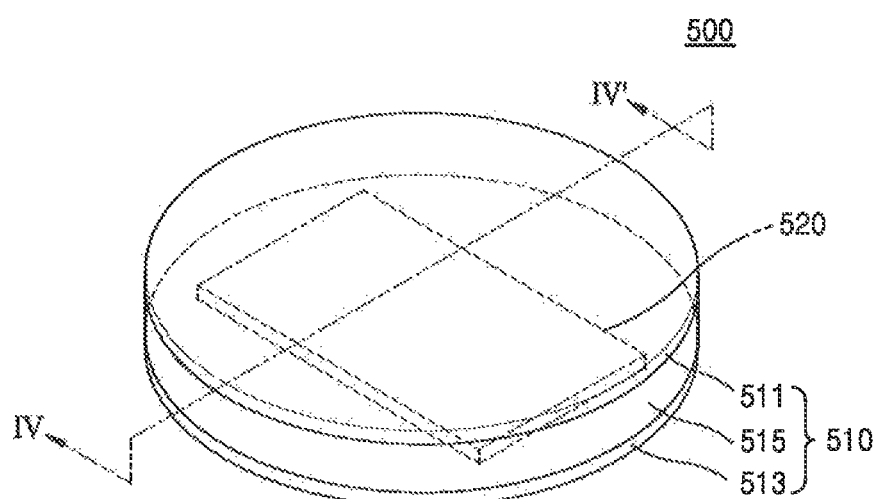
FIG. 3 is a perspective view illustrating a sensor module according to an exemplary embodiment of the inventive concept.

FIG. 3 is a perspective view illustrating a sensor module 500 according to an exemplary embodiment of the inventive concept.

Referring to FIG. 3, the sensor module 500 may include a sensor body 510 and a sensor circuit unit 520.

The sensor module 500 may have substantially the same shape, size, and/or weight as a wafer. The sensor body 510 may have substantially the same appearance as a wafer. In an exemplary embodiment of the inventive concept, the sensor body 510 may have a circular plate shape.

The sensor body 510 may include an upper plate 511, a lower plate 513, and a sealing layer 515.

The upper plate 511 and the lower plate 513 may be spaced apart from each other with the sealing layer 515 provided therebetween. The upper plate 511 and the lower plate 513 may have a circular plate shape. The upper plate 511 may cover an upper surface of the sealing layer 515 and the lower plate 513 may cover a lower surface of the sealing layer 515.

In an exemplary embodiment of the inventive concept, at least one of the upper plate 511 and the lower plate 513 may be formed of the same material as the wafer. For example, at least one of the upper plate 511 and the lower plate 513 may be formed of silicon. Since at least one of the upper plate 511 and the lower plate 513 is formed of the same material as the wafer, characteristics of the process environment sensed by the sensor module 500 may closely correspond to the process environment applied to the wafer during a semiconductor manufacturing processes. For example, a pressure sensed by the upper plate 511 or the lower plate 513 may be the same as pressure applied to the wafer when the wafer is undergoing a semiconductor manufacturing process.

The sealing layer 515 may seal the sensor circuit unit 520. The sealing layer 515 is between the upper plate 511 and the lower plate 513 and may cover at least a part of the sensor circuit unit 520. The sealing layer 515 may be formed of a material having chemical resistance and heat resistance to prevent the sensor circuit unit 520 from being damaged. For example, the sealing layer 515 may be formed of an epoxy-based material, a thermosetting material, a thermoplastic material, or an ultraviolet (UV) processing material. The thermosetting material may include a phenolic hardener, an acid anhydride hardener, or an amine hardener and an additive of acrylic polymer. In addition, the sealing layer 515 is formed of a resin and may include a filler. The sealing layer 515 may be formed by a common molding process or a molded underfill (MUF) process.

The sensor circuit unit 520 may be embedded in the sensor body 510. The sensor circuit unit 520 may include sensors for sensing the process environment in the semiconductor equipment and sensors for detecting the position of the sensor module 500 in the semiconductor equipment. For example, the sensor circuit unit 520 may include the first sensor 110 and the second sensor 120 that are illustrated in FIG. 1.

Figure 4:
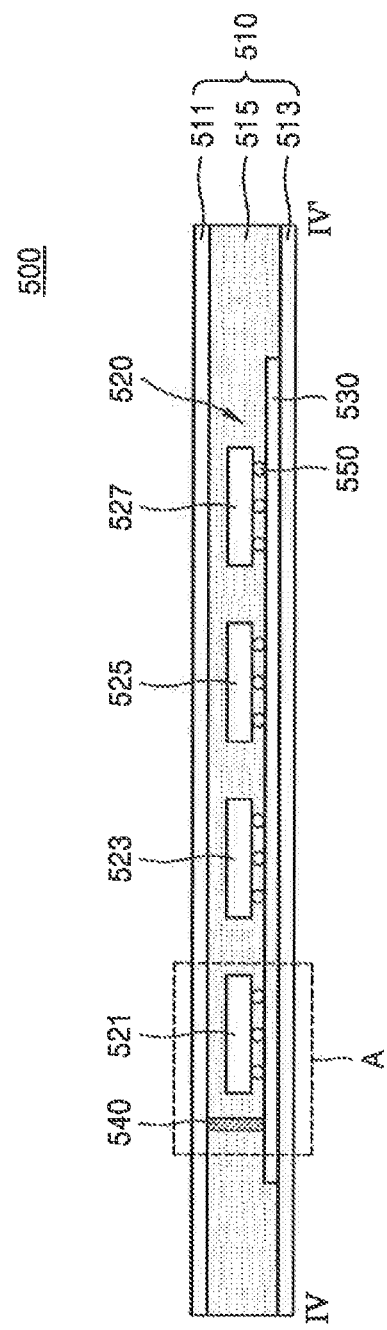
FIG. 4 is a cross-sectional view of the sensor module taken along line IV-IV' of FIG. 3.

FIG. 4 is a cross-sectional view of the sensor module 500 taken along line IV-IV' of FIG. 3.

Referring to FIG. 4, the sensor circuit unit 520 may include a substrate 530 mounted with a first sensor 521, a second sensor 523, a signal processing module 525, and a wireless communication module 527. The first sensor 521, the second sensor 523, the signal processing module 525, and the wireless communication module 527 may be substantially the same as the first sensor 110, the second sensor 120, the signal processing module 130, and the wireless communication module 140 that are illustrated in FIG. 1.

The substrate 530 may be, for example, a printed circuit board (PCB). The substrate 530 may be a single-sided PCB, a double-sided PCB, or a multilayer PCB including one or more wiring layers. Furthermore, the substrate 530 may be a rigid PCB or a flexible PCB.

Figure 5:
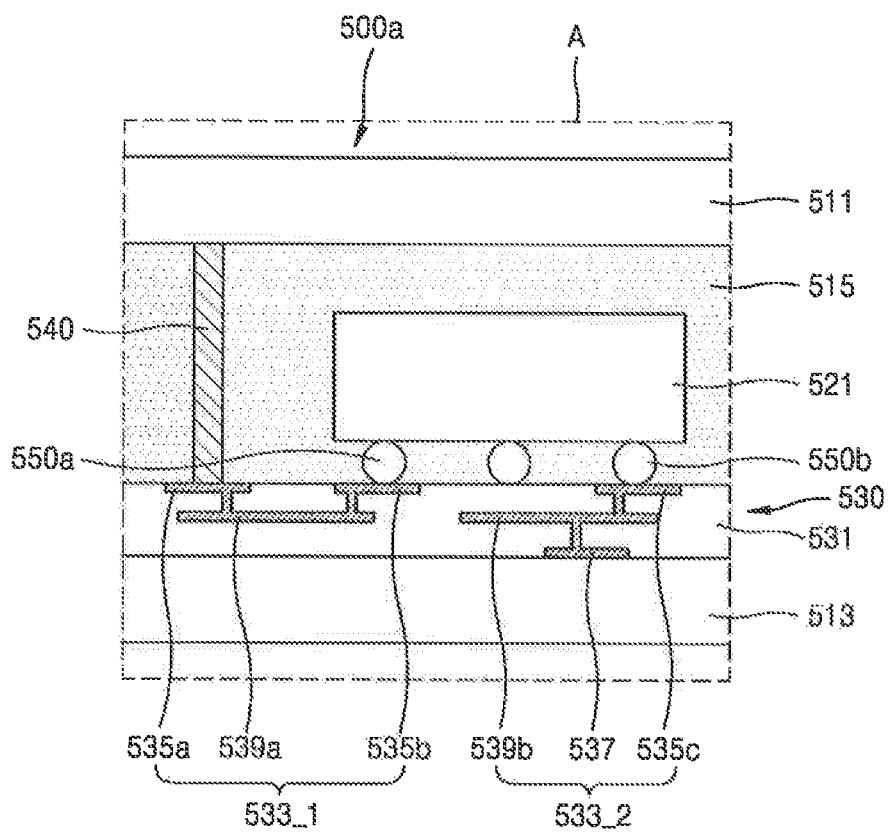
FIG. 5 is a cross-sectional view illustrating a sensor module according to an exemplary embodiment of the inventive concept, which illustrates parts corresponding to a region A of FIG. 4.

The substrate 530 may include a substrate base (refer to 531 of FIG. 5) and interconnections (refer to 533_1 and 533_2 of FIG. 5). The substrate base 531 may be formed of an insulating material, for example, phenol resin, epoxy resin, or polyimide. The interconnections may include upper wiring layers (refer to 535a, 535b, and 535c of FIG. 5) formed on an upper surface of the substrate base 531, a lower wiring layer (refer to 537 of FIG. 5) formed on a lower surface of the substrate base 531, and internal wirings (refer to 539a and 539b of FIG. 5) formed in the substrate base 531. The internal wirings of the substrate 530 may include an internal wiring layer and a via that vertically extends through the substrate base 531 to electrically connect the upper wiring layer to the lower wiring layer.

The first sensor 521, the second sensor 523, the signal processing module 525, and the wireless communication module 527 may be mounted on the substrate 530. The first sensor 521, the second sensor 523, the signal processing module 525, and the wireless communication module 527 may be electrically connected to the substrate 530 through connection terminals 550 attached to lower surfaces thereof. In this case, parts of the upper wiring layers of the substrate 530 connected to the connection terminals 550 may form an upper pad.

As illustrated in FIG. 4, the first sensor 521, the second sensor 523, the signal processing module 525, and the wireless communication module 527 may be arranged to be separate from each other on the substrate 530 in a horizontal direction. In an exemplary embodiment of the inventive concept, at least one of the first sensor 521, the second sensor 523, the signal processing module 525, and the wireless communication module 527 may be stacked in a vertical direction.

In an exemplary embodiment of the inventive concept, the first sensor 521 for detecting an electric characteristic applied to the sensor module 500 in the semiconductor equipment may be, for example, a sensor for sensing static electricity. In this case, the first sensor 521 may be electrically connected to at least one of the upper plate 511 and the lower plate 513. Since the first sensor 521 is electrically connected to the upper plate 511 and/or the lower plate 513, the first sensor 521 may sense static electricity induced to the upper plate 511 and/or static electricity induced to the lower plate 513. Therefore, the first sensor 521 may generate an electrical characteristic value based on the sensed static electricity.

FIG. 5 is cross-sectional a view illustrating sensor module 500a according to an exemplary embodiment of the inventive concept, which illustrate parts corresponding to the region A of FIG. 4.

Figure 6:
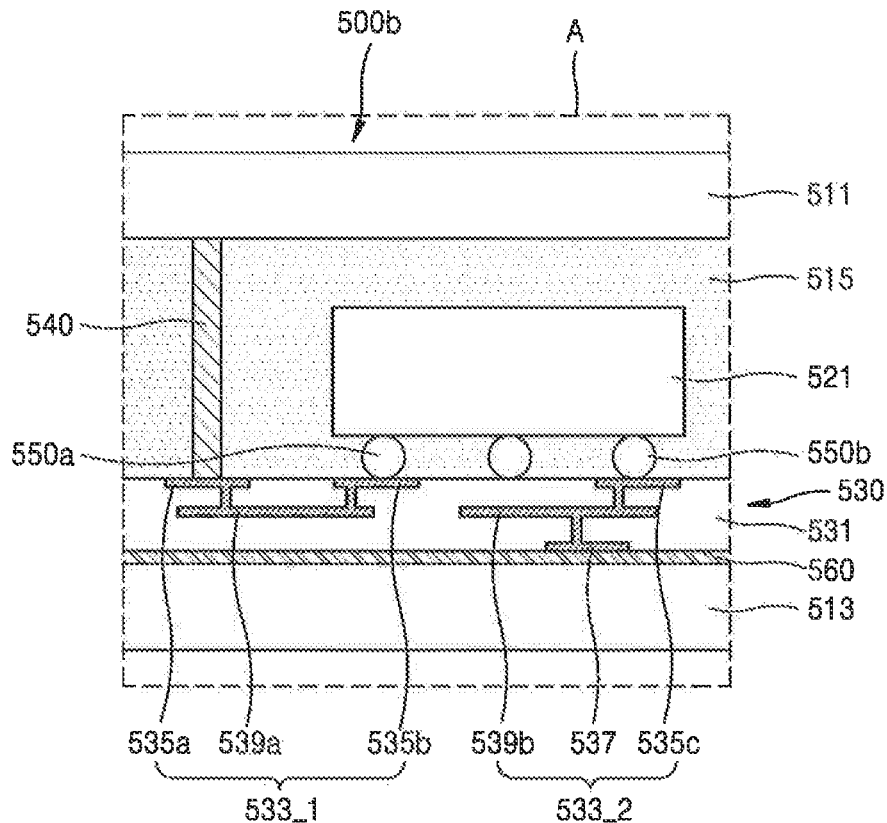
FIG. 6 is a cross-sectional view illustrating a sensor module according to an exemplary embodiment of the inventive concept, which illustrates parts corresponding to a region A of FIG. 4.

FIG. 6 is cross-sectional a view illustrating sensor module 500b according to an exemplary embodiment of the inventive concept, which illustrate parts corresponding to the region A of FIG. 4.

Referring to FIG. 5, the sensor module 500a may include a conductive pillar 540 for electrically connecting the upper plate 511 and the substrate 530. The conductive pillar 540 vertically extends through the sealing layer 515. One end of the conductive pillar 540 is connected to the upper plate 511 and the other end of the conductive pillar 540 may be connected to the upper wiring layer 535a of the substrate 530. The conductive pillar 540 may be referred to as a through mold via, or just a via. The first sensor 521 may be electrically connected to the upper plate 511 through, for example, a first connection path that passes through the connection terminal 550a, the upper wiring layer 535b of the substrate 530 that contacts the connection terminal 550a, the internal wiring 539a of the substrate 530, the upper wiring layer 535a of the substrate 530 that contacts the conductive pillar 540, and the conductive pillar 540.

In an exemplary embodiment of the inventive concept, the first sensor 521 may measure the intensity of the static electricity induced to the upper plate 511 by measuring an amount of charge provided to the upper plate 511 through the first connection path. In an exemplary embodiment of the inventive concept, the first sensor 521 may be grounded through the first connection path.

Furthermore, the first sensor 521 may be electrically connected to the lower plate 513 through the substrate 530. For example, the first sensor 521 may be electrically connected to the lower plate 513 through a second connection path that passes through the connection terminal 550b, the upper wiring layer 535c of the substrate 530 that contacts the connection terminal 550b, the internal wiring 539b of the substrate 530, and the lower wiring layer 537 of the substrate 530.

In an exemplary embodiment of the inventive concept, the first sensor 521 may measure the intensity of the static electricity induced to the lower plate 513 by measuring an amount of charge provided to the lower plate 513 through the second connection path. In an exemplary embodiment of the inventive concept, the first sensor 521 may be grounded through the second connection path.

Referring to FIG. 6, the sensor module 500b may include a conductive film 560 between the substrate 530 and the lower plate 513. The conductive film 560 may provide adhesive force for fixing the substrate 530 to the lower plate 513. In addition, the conductive film 560 may electrically connect the substrate 530 to the lower plate 513. The conductive film 560 may contact the lower wiring layer 537 of the substrate 530.

In an exemplary embodiment of the inventive concept, the first sensor 521 may be electrically connected to the lower plate 513 through a third connection path that passes through the connection terminal 550b, the upper wiring layer 535c of the substrate 530 that contacts the connection terminal 550b, the internal wiring 539b of the substrate 530, the lower wiring layer 537 of the substrate 530, and the conductive film 560.

In an exemplary embodiment of the inventive concept, the first sensor 521 may measure the intensity of the static electricity induced to the lower plate 513 through the third connection path. In an exemplary embodiment of the inventive concept, the first sensor 521 may be grounded through the third connection path.

The conductive film 560 may be an anisotropic conductive film that is manufactured by mixing fine conductive particles with adhesive resin to be film-shaped and that provides a path through which electricity flows in one direction. However, the inventive concept is not limited thereto. For example, the conductive film 560 may include members that may provide an electric connection path between the substrate 530 and the lower plate 513 such as an anisotropic conductive paste.

Figure 7:
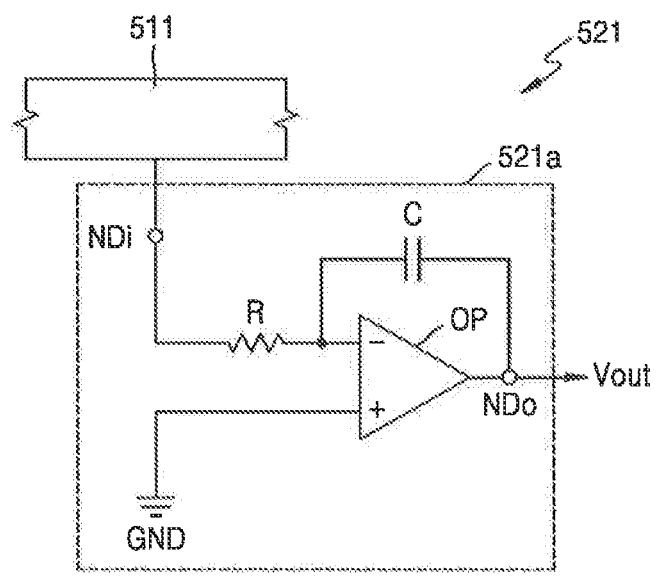
FIG. 7 is a circuit diagram illustrating a first sensor according to an exemplary embodiment of the inventive concept.

FIG. 7 is a circuit diagram illustrating the first sensor 521 according to an exemplary embodiment of the inventive concept. In FIG. 7, the first sensor 521 is a sensor for sensing static electricity applied to the sensor module.

Referring to FIG. 7, the first sensor 521 may include an integrator circuit 521a for amplifying a value corresponding to the amount of charge provided to the upper plate 511 and for outputting the amplified value. For example, the integrator circuit 521a may include an operational amplifier OP, a resistor R between an inversion input terminal (−) of the operational amplifier OP and an input end NDi, and a capacitor C arranged between the inversion input terminal (−) of the operational amplifier OP and an output end NDo. The input and output ends NDi and NDo may be nodes. A non-inversion input terminal (−) of the operational amplifier OP may be connected to a ground terminal GND. The integrator circuit 521a amplifies charges received from the upper plate 511 through the input end NDi and may output an output signal Vout through the output end NDo.

Figure 8:
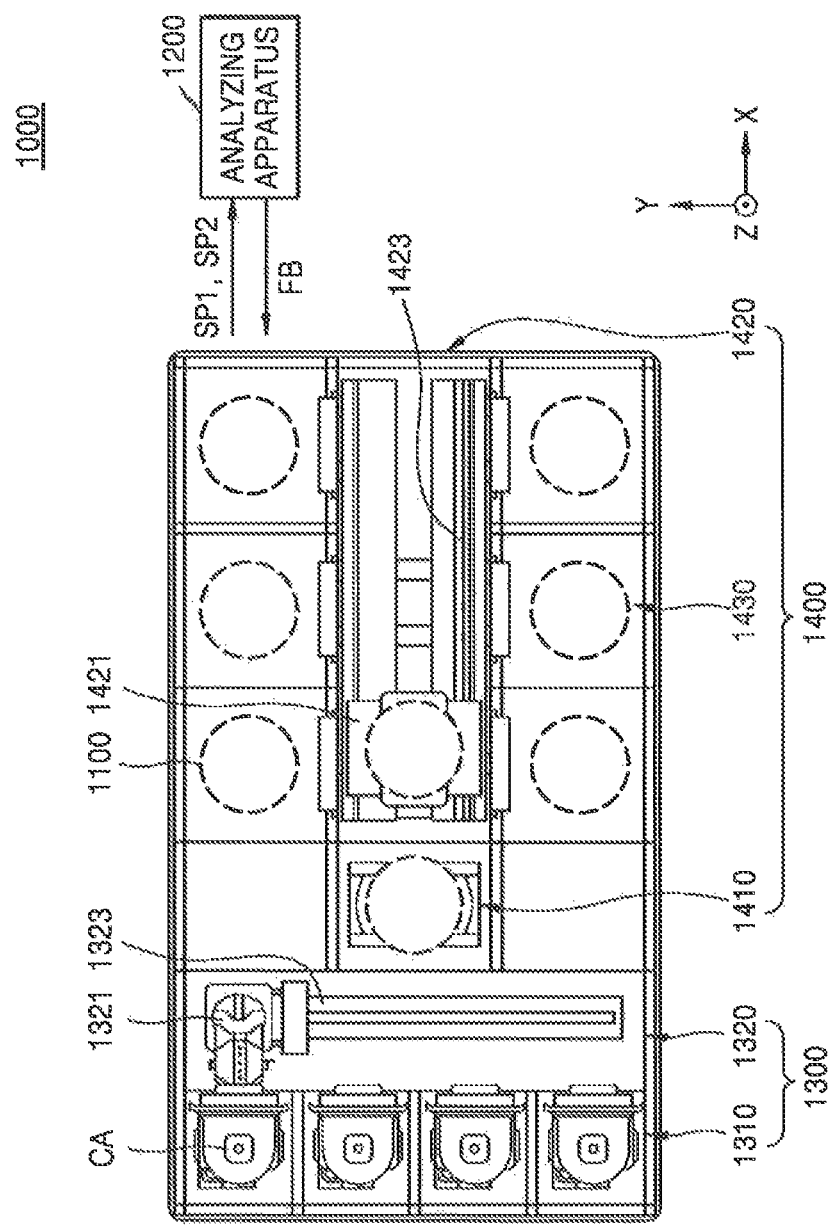
FIG. 8 is a plan view illustrating a semiconductor manufacturing apparatus according to an exemplary embodiment of the inventive concept.

FIG. 8 is a plan view illustrating a semiconductor manufacturing apparatus 1000 according to an exemplary embodiment of the inventive concept. The semiconductor manufacturing apparatus 1000 illustrated in FIG. 8 may perform semiconductor manufacturing processes on a wafer and may perform a process of monitoring a process environment in semiconductor equipment before performing the semiconductor manufacturing processes on the wafer. In FIG. 8, a case in which the semiconductor manufacturing apparatus 1000 performs a monitoring process will be described.

Referring to FIG. 8, the semiconductor manufacturing apparatus 1000 may include an index module 1300 and a process module 1400.

The index module 1300 receives sensor modules 1100 transferred from the outside, positions the sensor modules 1100 in the process module 1400, and may take out the sensor modules 1100 that undergo the semiconductor manufacturing processes in the process module 1400 from the process module 1400. The sensor modules 1100 may be one of the sensor modules 100, 100a, 500, 500a, and 500b illustrated with reference to FIGS. 1 to 7. The sensor modules 1100 may also be a sensor module modified from the above described sensor modules.

The index module 1300 may include load ports 1310 and a transfer frame 1320. Carriers CA in which the sensor modules 1100 are accommodated may be seated on the load ports 1310. The plurality of load ports 1310 may be provided in the index module 1300. However, the inventive concept is not limited thereto. The number of load ports 1310 may vary in accordance process efficiency and process control conditions of the semiconductor manufacturing apparatus 1000. For example, a front opening unified pod or a front opening universal pod (FOUP) may be used as the carrier CA.

In an exemplary embodiment of the inventive concept, the carrier CA may accommodate wafers with the sensor modules 1100. In this case, while the monitoring process is performed, the wafers may stand-by in the carriers CA.

The transfer frame 1320 may transfer the sensor modules 1100 between the carriers CA seated on the load ports 1310 and the process module 1400. The transfer frame 1320 may include an index robot 1321 configured to move on an index rail 1323, wherein the index robot 1321 is capable of transferring the sensor modules 1100.

The process module 1400 for performing the semiconductor manufacturing processes may include a load lock chamber 1410, a transfer chamber 1420, and process chambers 1430.

The load lock chamber 1410 may be arranged between the index module 1300 and the transfer chamber 1420. The load lock chamber 1410 may have a first port connected to the index module 1300 and a second port connected to the transfer chamber 1420. The load lock chamber 1410 provides a space in which the sensor module 1100 temporarily stays and may have a buffer slot in which the sensor module 1100 may be placed. The index robot 1321 may remove the sensor module 1100 from the carrier CA and may put the sensor module 1100 in the buffer slot. A transfer robot 1421 of the transfer chamber 1420 may remove the sensor module 1100 from the buffer slot, may take the sensor module 1100 from the process chamber 1430, and may put the sensor module 1100 in the buffer slot.

The transfer chamber 1420 may transfer the sensor module 1100 between the load lock chamber 1410 and the process chamber 1430. The load lock chamber 1410 and the process chamber 1430 are arranged around the transfer chamber 1420. The transfer chamber 1420 may include the transfer robot 1421 and a transfer rail 1423. The transfer robot 1421 may transfer the sensor module 1100 while moving on the transfer rail 1423.

The process chamber 1430 may be where the semiconductor manufacturing processes are performed on the sensor module 1100 that was transferred from the transfer chamber 1420. In other words, the process chamber 1430 may provide the same atmosphere as that which was used to perform the semiconductor manufacturing processes on the wafer to the sensor module 1100. For example, the process chamber 1430 may subject the sensor module 1100 to the same atmospheres used in the drying process, the cleaning process, the depositing process, the etching process, and/or the diffusing process for the wafer. The plurality of process chambers 1430 may be provided in the process module 1400. For example, the plurality of process chambers 1430 may be arranged at one side or the other side of the transfer chamber 1420 in a longitudinal direction of the transfer chamber 1420.

An analyzing apparatus 1200 may be communicate with the sensor module 1100 in real time and may receive the process environment sensing information SP1 and the position information SP2 that are generated by the sensor module 1100. The analyzing apparatus 1200 may be one of the analyzing apparatuses 200 and 200a described with reference to FIGS. 1 and 2 or a modified version of those analyzing apparatuses.

Since the sensor module 1100 may sense the process environment in the semiconductor equipment while moving along the movement path of the wafer in the semiconductor equipment, the process environment may be monitored in all sections of the semiconductor equipment by the analyzing apparatus 1200.

For example, when the sensor module 1100 includes a sensor for sensing static electricity in the semiconductor equipment, the sensor module 1100 may sense static electricity generated when the sensor module 1100 is transferred. For example, the sensor module 1100 may sense static electricity that is generated in the wafer when the wafer contacts the transfer member such as the index robot 1321 of the index module 1300 or the transfer robot 1421 of the transfer chamber 1420. In addition, the sensor module 1100 may sense static electricity that may be induced to the wafer by tools in the semiconductor equipment. For example, tools arranged near the transfer path of the wafer may induce static electricity to the wafer. Furthermore, the sensor module 1100 may measure static electricity that may be induced to the wafer during the semiconductor manufacturing processes performed in the process chamber 1430. For example, the sensor module 1100 may sense static electricity generated due to friction between a chemical liquid and the wafer.

In addition, the analyzing apparatus 1200 may determine whether a defect in the process environment is generated in a specific section in the semiconductor equipment or in a particular piece of equipment. Furthermore, the analyzing apparatus 1200 may determine whether the defect in the process environment is caused by the specific semiconductor manufacturing process by analyzing the position information SP2 transmitted from the sensor module 1100. In particular, since the position of the sensor module 1100 may be detected in real time, even if the sensor module 1100 is positioned in a blind area of the semiconductor equipment, the position of the sensor module 1100 may be accurately detected.

Furthermore, the analyzing apparatus 1200 may perform a feedback operation for optimizing the process environment of the semiconductor equipment. The analyzing apparatus 1200 applies the feedback signal FB, which is associated with a step of removing the detected defect from the process environment, to the semiconductor equipment. In accordance with the applied feedback signal FB, an operation for removing the defect in the process environment may be performed in the semiconductor equipment.

In an exemplary embodiment of the inventive concept, when static electricity of no less than an allowable range is sensed in a specific chamber in the semiconductor equipment, the analyzing apparatus 1200 may generate the feedback signal FB for removing static electricity from that chamber. For example, as the feedback signal FB is applied to the chamber, the chamber may remove static electricity by operating an ionizer and may control an environment in the chamber so that relative humidity in the chamber increases.

Figure 9:
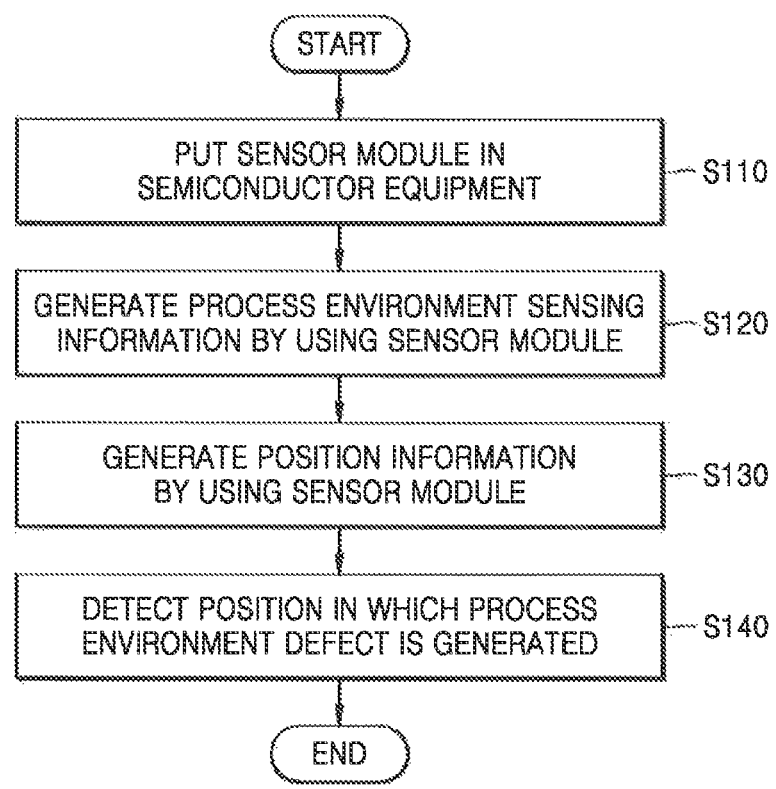
FIG. 9 is a flowchart illustrating a monitoring method according to an exemplary embodiment of the inventive concept.
Figure 10:
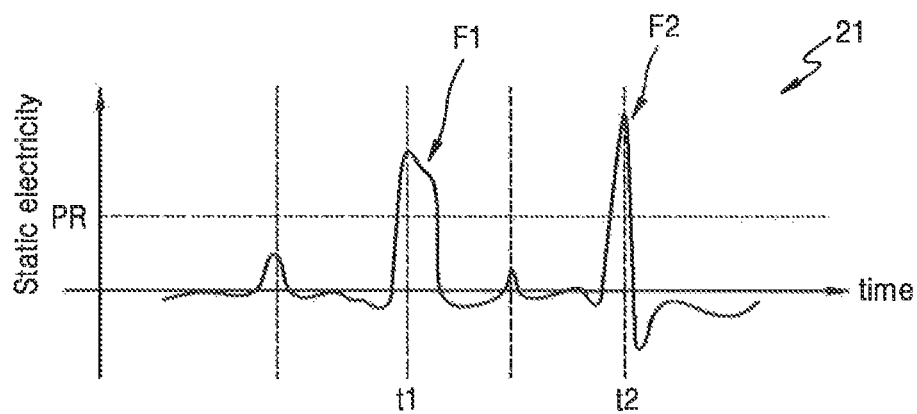
FIG. 10 is a graph illustrating static electricity sensing information as an example of process environment sensing information generated by a sensor module, according to an exemplary embodiment of the inventive concept.
Figure 11:
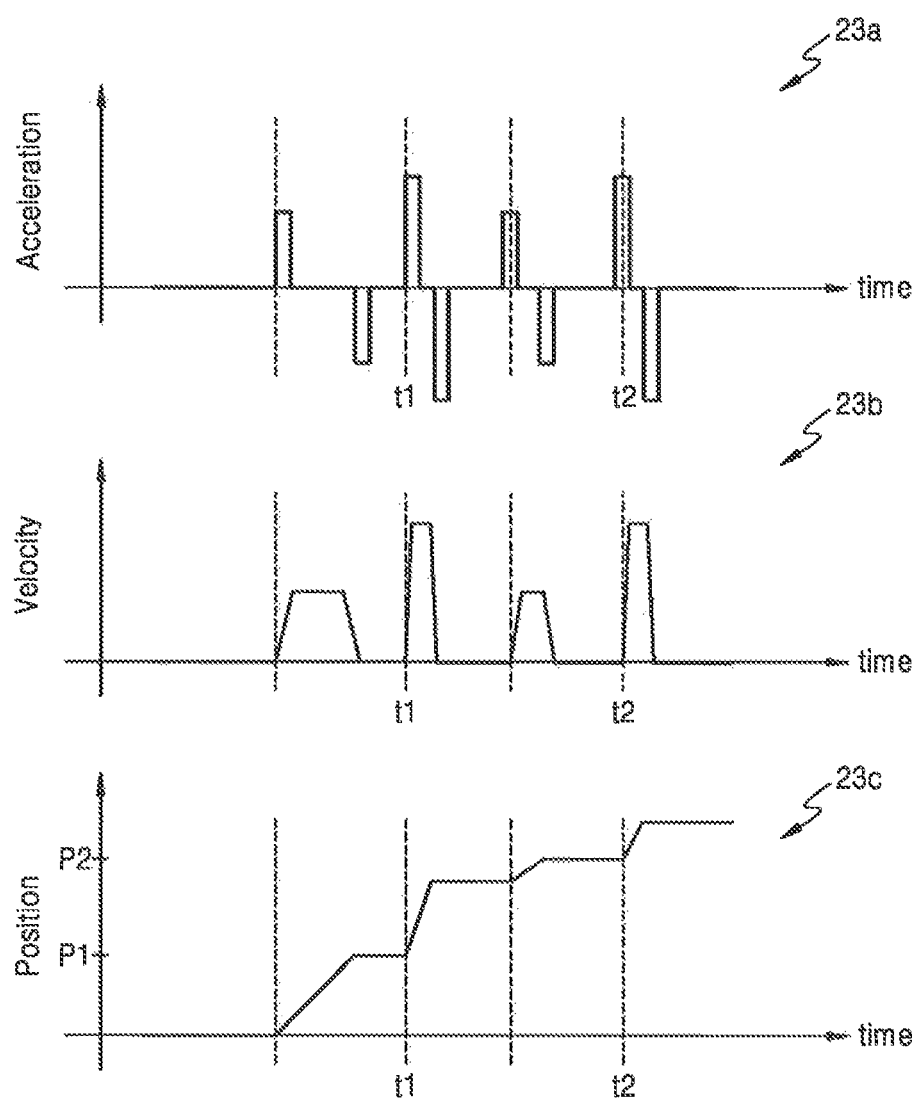
FIG. 11 is a graph illustrating position information generated by a sensor module, according to an exemplary embodiment of the inventive concept.

FIG. 9 is a flowchart illustrating a monitoring method according to an exemplary embodiment of the inventive concept. FIG. 10 is a graph illustrating static electricity sensing information as an example of process environment sensing information generated by a sensor module, according to an exemplary embodiment of the inventive concept. FIG. 11 is a graph illustrating position information generated by a sensor module, according to an exemplary embodiment of the inventive concept.

Referring to FIG. 9, the sensor module is put in the semiconductor equipment in operation S110. The sensor module may include a sensor for sensing the process environment in the semiconductor equipment and a sensor for detecting the position of the sensor module in the semiconductor equipment. The sensor module put in the semiconductor equipment may be loaded to the load port (e.g., 1310 of FIG. 8) of the semiconductor equipment. Prior to being loaded into the load part, the sensor module may be accommodated in a carrier such as a FOUP.

Referring to FIGS. 9 and 10, the process environment sensing information regarding the process environment sensed in the semiconductor equipment is generated by using the sensor module in operation S120. In the semiconductor equipment, the sensor module may move along the movement path of the wafer and measure the process environment that may be applied to the wafer, for example, static electricity, pressure, vibration, temperature, humidity, and/or shock.

As illustrated in FIG. 10, as an example of the process environment sensing information generated by the sensor module, the static electricity sensing information may include the intensity of static electricity over time. For example, the static electricity sensing information may be represented by a graph 21. In the graph 21, a horizontal axis represents time and a vertical axis represents intensity of static electricity, for example, an output voltage.

Referring to FIGS. 9 and 11, the position information on the position of the sensor module configured to move in the semiconductor equipment is generated in operation S130. The sensor module generates the process environment sensing information and the position. information and transmits the process environment sensing information and the position information to the external analyzing apparatus in real time.

As illustrated in FIG. 11, the sensor module may generate the position information by using the acceleration sensor which measures the acceleration of the sensor module.

First, to generate the position information, the sensor module generates the acceleration information including acceleration over time. The acceleration information may include acceleration of the sensor module in the X axis direction, acceleration of the sensor module in the Y axis direction, and acceleration of the sensor module in the Z axis direction. The acceleration information may be represented by a graph 23a For example, the graph 23a represents the acceleration in the X axis direction of FIG. 8. In the graph 23a, a horizontal axis represents time and a vertical axis represents acceleration.

When the acceleration information is generated, velocity information of the sensor module is generated by integrating the acceleration information. The velocity information may include velocity of the sensor module in the X axis direction, velocity of the sensor module in the Y axis direction, and velocity of the sensor module in the Z axis direction. The velocity information may be represented by a graph 23b. For example, the graph 23b represents the velocity in the X axis direction of FIG. 8. In the graph 23b, a horizontal axis represents time and a vertical axis represents velocity.

When the velocity information is generated, the position information of the sensor module is generated by integrating the velocity information. The position information may include displacement of the sensor module in the X axis direction, displacement of the sensor module in the Y axis direction, and displacement of the sensor module in the Z axis direction. The position information may be represented by a graph 23c. For example, the graph 23c represents the displacement in the X axis direction of FIG. 8. In the graph 23c, a horizontal axis represents time and a vertical axis represents displacement (or position).

Referring to FIG. 9, a position where the defect in the process environment is generated is detected based on the process environment sensing information and the position information in operation S140. For example, when a defect in the process environment of no less than the allowable range is sensed in the sensor module, a position where the defect in the process environment is generated may be detected by detecting the position of the sensor module at the same point in time as the point in time when the defect in the process environment is sensed.

For example, points of time t1 and t2 at which static electricity components F1 and F2 of no less than (e.g., greater than) an allowable range PR are sensed may be detected with the static electricity sensing information illustrated in FIG. 10. When the points of time t1 and t2 at which the high static electricity components F1 and F2 are generated are detected, positions in the X axis direction where the defect in the process environment was generated may be detected by positions P1 and P2 of the sensor module at the points of time t1 and t2. The positions P1 and P2 of the sensor module may be detected using the position information illustrated in FIG. 11. After detecting positions of the sensor module in the Y and Z axes directions at the points of time t1 and t2, the position where the defect in the process environment is generated in the semiconductor equipment can be known from the detected positions in the X, Y, and Z axes directions.

When the position where the defect in the process environment is generated is detected, the sensor module is taken out of the semiconductor equipment and the defect in the process environment in the detected position is removed. When the defect in the process environment is not detected in the monitoring process or the defect in the process environment detected by the monitoring process is removed, the sensor module is taken out of the semiconductor equipment. Thereafter, the wafer standing by in the carrier is put in the semiconductor equipment, and the semiconductor manufacturing processes are performed on that wafer.

Figure 12:
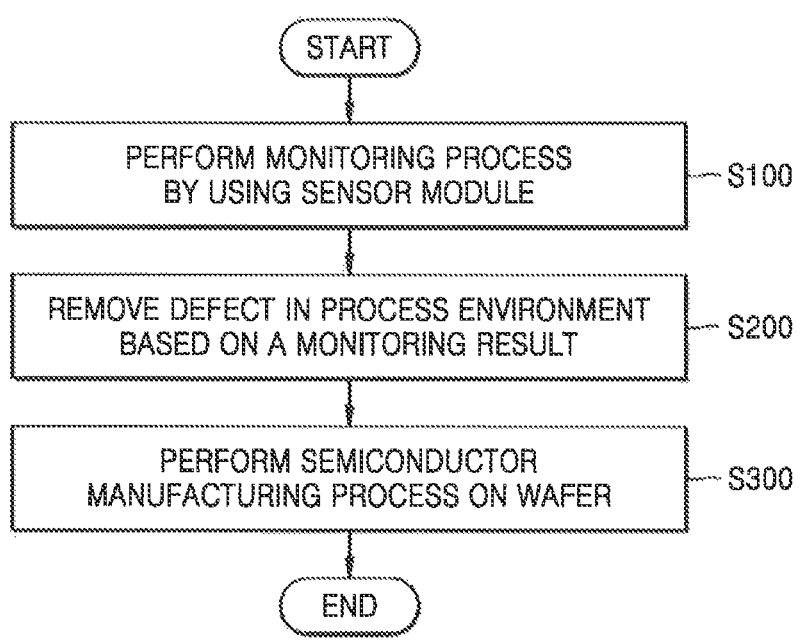
FIG. 12 is a flowchart illustrating a method of manufacturing a semiconductor device according to an exemplary embodiment of the inventive concept.

FIG. 12 is a flowchart illustrating a method of manufacturing a semiconductor device according to an exemplary embodiment of the inventive concept.

Referring to FIG. 12, first, as described with reference to FIGS. 9 to 11, a process of monitoring the process environment in the semiconductor equipment is performed by using the sensor module in operation S100. As described above, the position where the defect in the process environment is generated may be detected by the monitoring process.

After performing the monitoring process, the defect in the process environment in the semiconductor equipment is removed based on a monitoring result in operation S200. To remove the defect in the process environment, a maintenance operation for removing the defect in the process environment is performed on the semiconductor equipment arranged in the position where the defect occurred, or process conditions of the semiconductor manufacturing processes that cause the defect in the process environment may be changed.

After removing the defect in the process environment, the semiconductor manufacturing processes are performed on the wafer in operation S300. The semiconductor manufacturing processes performed on the wafer may include various processes. For example, the semiconductor manufacturing processes performed on the wafer may include a depositing process, an etching process, an ionizing process, and a cleaning process. Integrated circuits and interconnections that are required by a corresponding semiconductor device may be formed by performing the semiconductor manufacturing processes on the wafer. Then, the wafer may be divided into semiconductor chips and a packaging process may be performed on the divided semiconductor chips.

In a method of manufacturing a semiconductor device according to an exemplary embodiment of the inventive concept, since a defect in a process environment may be removed by a monitoring process of the sensor module, the semiconductor manufacturing processes performed on the wafer may be optimized. Since semiconductor devices are manufactured in the optimized process environment, an excellent and reliable semiconductor device can be realized.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A sensor module for detecting a process environment in semiconductor equipment, the sensor module comprising:
   a sensor body including a first plate and a second plate; and
   a sensor circuit unit in the sensor body, wherein the sensor circuit unit comprises a static electricity sensor between the first plate and the second plate, wherein the sensor body further comprises a sealing layer for sealing the sensor circuit unit.

2. The sensor module of claim 1, wherein at least one of the first plate and the second plate comprises silicon.

3. The sensor module of claim 1, wherein the sensor circuit unit further comprises an acceleration sensor.

4. The sensor module of claim 3, wherein the sensor circuit unit further comprises a signal processing module,
   wherein the signal processing module is configured to,
   generate static electricity sensing information based on a signal output from the static electricity sensor, and
   generate position information of the sensor module based on a signal output from the acceleration sensor.

5. The sensor module of claim 4, further comprising a wireless communication module for outputting the static electricity sensing information and the position information from the signal processing module.

6. The sensor module of claim 1,
   wherein the sensor circuit unit comprises a substrate on which the static electricity sensor is mounted, and
   wherein the substrate is electrically connected to the first plate and the second plate.

7. The sensor module of claim 6, further comprising a conductive pillar extending between the first plate and the substrate to electrically connect the first plate to the substrate.

8. The sensor module of claim 6, further comprising a conductive film between the substrate and the second plate to electrically connect the substrate to the second plate.

9. The sensor module of claim 1, wherein the static electricity sensor comprises an integrator circuit connected to the first plate to amplify charges received from the first plate.

10. The sensor module of claim 1, wherein the sensor body has a circular shape.

11. A sensor module for detecting a process environment in semiconductor equipment, the sensor module comprising:
a first sensor configured to sense a process environment to which the sensor module is exposed;
a second sensor configured to detect a position of the sensor module in the semiconductor equipment; and
a signal processing module configured to,
generate process environment sensing information about the process environment based on a signal output from the first sensor, and
generate position information of the sensor module based on a signal output from the second sensor.

12. The sensor module of claim 11, wherein the sensor module comprises:
a sensor body; and
a sensor circuit unit in the sensor body, wherein the sensor circuit unit comprises the first sensor and the second sensor.

13. The sensor module of claim 12, wherein the sensor body comprises:
a first plate and a second plate; and
a sealing layer between the first plate and the second plate.

14. The sensor module of claim 13, wherein the first sensor comprises a static electricity sensor, and wherein the static electricity sensor is electrically connected to the first plate or the second plate.

15. The sensor module of claim 11, wherein the first sensor comprises a static electricity sensor, a vibration sensor, a pressure sensor, a temperature sensor, or a humidity sensor.

16. The sensor module of claim 11,
wherein the second sensor comprises an acceleration sensor, and
wherein the signal processing module is configured to generate position information of the sensor module in the semiconductor equipment based on an acceleration signal of the sensor module that is output from the second sensor.

17. A sensor module for detecting a process environment in semiconductor equipment, the sensor module comprising:
a sensor circuit unit disposed between a first plate and a second plate, the sensor circuit unit including a static electricity sensor and an acceleration sensor;
the sensor circuit unit further including a sensing information generator configured to generate process environment sensing information based on an amount of static electricity detected by the static electricity sensor, and a position information generator configured to generate position information based on acceleration information provided from the acceleration sensor.

18. The sensor module of claim 17, wherein the sensor module has substantially the same, shape, size and characteristics of a wafer that is to be processed in the semiconductor equipment.

19. The sensor module of claim 17, wherein the sensor circuit unit is embedded in a sensor body.

* * * * *